(12) United States Patent
Richard et al.

(10) Patent No.: US 11,761,793 B2
(45) Date of Patent: Sep. 19, 2023

(54) MAGNETIC SENSOR PACKAGE

(71) Applicant: Analog Devices International Unlimited Company, County Limerick (IE)

(72) Inventors: Aude Richard, Limerick (IE); Michael Mueller-Aulmann, NiedererBach (DE); Peter James Tonge, Newbury (GB); Monsoon Dutt, London (GB); Jan Kubik, Limerick (IE); John O'Dowd, Crecora (IE); Enda Joseph Nicholl, Kilmallock (IE); Stephen O'Brien, Limerick (IE); Jochen Schmitt, Biedenkopf (DE); Robert Guyol, St Louis, MO (US); Christian Nau, Marburg (DE); Colin P. Giles, Berkshire (GB); Brian O'Mara, Limerick (IE); Wenmei Wang, Reading (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/326,976

(22) Filed: May 21, 2021

(65) Prior Publication Data
US 2021/0372818 A1    Dec. 2, 2021

Related U.S. Application Data

(60) Provisional application No. 63/029,828, filed on May 26, 2020.

(51) Int. Cl.
*G01D 5/14* (2006.01)

(52) U.S. Cl.
CPC ................ *G01D 5/14* (2013.01)

(58) Field of Classification Search
CPC ........................................... G01D 5/14
See application file for complete search history.

(56) References Cited

U.S. PATENT DOCUMENTS

| | | | |
|---|---|---|---|
| 5,637,995 A * | 6/1997 | Izawa | G01P 3/488 |
| | | | 324/207.21 |
| 7,017,274 B2 | 3/2006 | Stobbe | |
| (Continued) | | | |

FOREIGN PATENT DOCUMENTS

| | | |
|---|---|---|
| CN | 109 556 638 | 4/2019 |
| DE | 29924383 U1 | 1/2003 |
| (Continued) | | |

OTHER PUBLICATIONS

International Search Report and Written Opinion in PCT/EP2021/063743, dated Sep. 3, 2021.

*Primary Examiner* — Walter L Lindsay, Jr.
*Assistant Examiner* — Milton Gonzalez
(74) *Attorney, Agent, or Firm* — Knobbe, Martens, Olson & Bear, LLP

(57) ABSTRACT

A magnetic sensor package comprising a magnetic multi-turn sensor die and a magnetic single turn sensor die, in which both sensor dies are packaged on the same lead frame. A method of manufacturing the magnetic sensor package is also provided. A magnetic sensor system comprising a rotating magnet and the magnetic sensor package, where the sensor package is arranged so that both sensor dies sit within a homogenous magnetic field, thereby ensuring that the output signal of each sensor is not corrupted by any stray fields.

20 Claims, 17 Drawing Sheets

(56) References Cited

U.S. PATENT DOCUMENTS

| | | | |
|---|---|---|---|
| 7,595,635 B2 | 9/2009 | Uemura et al. | |
| 7,906,961 B2 | 3/2011 | Abwa et al. | |
| 8,089,233 B2* | 1/2012 | Kanekawa | G01D 5/14 |
| | | | 318/400.38 |
| 8,575,924 B2* | 11/2013 | Gruber | G01P 1/026 |
| | | | 324/173 |
| 9,116,199 B2 | 8/2015 | Deak et al. | |
| 9,163,747 B2 | 10/2015 | Dolenti et al. | |
| 9,372,243 B2* | 6/2016 | Wada | G01R 33/091 |
| 9,389,099 B2 | 7/2016 | Deak et al. | |
| 2007/0200564 A1* | 8/2007 | Motz | G01R 33/09 |
| | | | 324/252 |
| 2018/0372510 A1* | 12/2018 | Mattheis | G01D 5/2449 |
| 2019/0077256 A1* | 3/2019 | Onaka | G01D 5/245 |
| 2019/0152524 A1* | 5/2019 | Fujita | G01D 5/14 |
| 2019/0242764 A1 | 8/2019 | Nicholl et al. | |
| 2019/0293455 A1 | 9/2019 | Tonge et al. | |
| 2020/0044591 A1 | 2/2020 | Herzog et al. | |
| 2021/0149000 A1* | 5/2021 | Saito | G01R 33/0011 |
| 2021/0288557 A1* | 9/2021 | Komasaki | H02K 7/116 |

FOREIGN PATENT DOCUMENTS

| | | |
|---|---|---|
| DE | 102011054494 A1 | 4/2013 |
| JP | 6236452 B2 | 11/2017 |
| WO | WO 2017/162232 A1 | 9/2017 |
| WO | WO 2018/113833 A1 | 6/2018 |

* cited by examiner

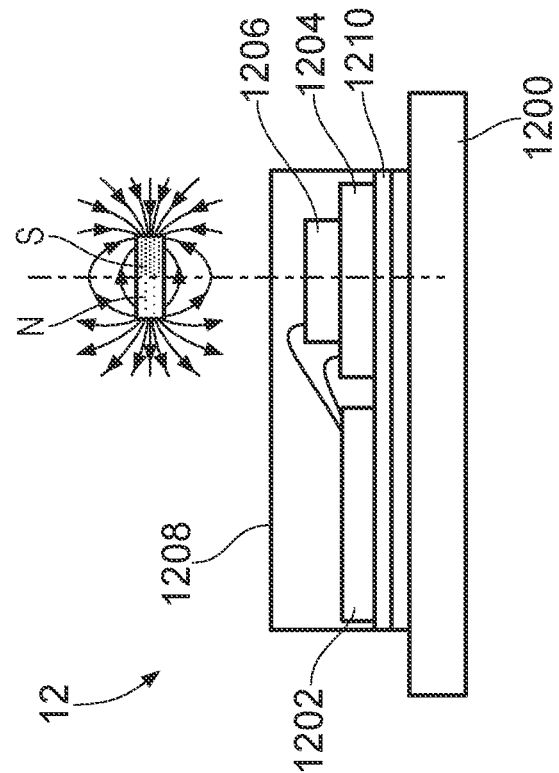
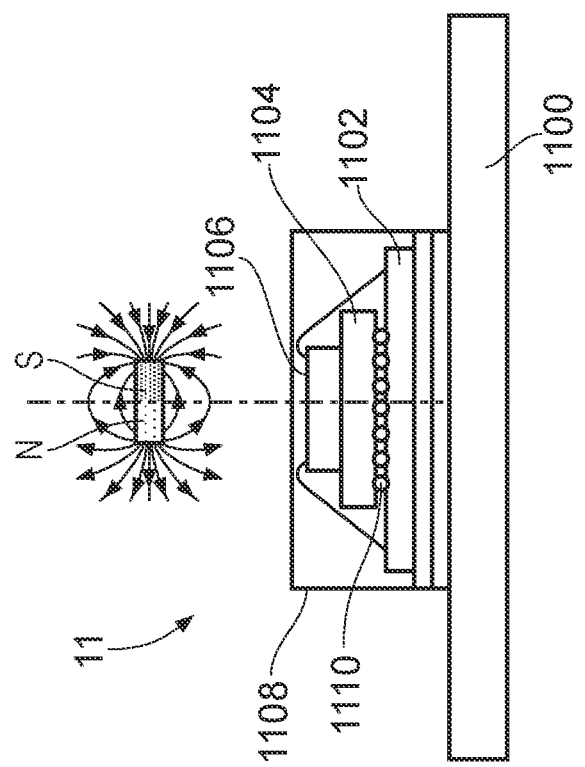

MAGNETIC SENSOR PACKAGE

INCORPORATION BY REFERENCE TO ANY PRIORITY APPLICATIONS

This application claims the benefit of priority of U.S. Provisional Application No. 63/029,828 filed May 26, 2020, the content of which is hereby incorporated by reference herein in its entirety. Any and all applications for which a foreign or domestic priority claim is identified in the Application Data Sheet as filed with the present application are hereby incorporated by reference under 37 CFR 1.57.

FIELD OF DISCLOSURE

The present disclosure relates to a magnetic sensor package. In particular, the present disclosure relates to a magnetic sensor package comprising a magnetic single turn sensor and a magnetic multi-turn sensor.

BACKGROUND

Magnetic single turn sensors and multi-turn sensors are commonly used in applications where there is a need to monitor both the number of times a device has been turned and its precise angular position. An example is a steering wheel in a vehicle. Magnetic multi-turn sensors and single turn sensors typically use magnetoresistive elements that are sensitive to an applied external magnetic field. The resistance of the magnetoresistive elements in multi-turn sensors can be changed by rotating a magnetic field within the vicinity of the sensor. Variations in the resistance of the magnetoresistive elements can be tracked to determine the number of turns in the magnetic field, which can be translated to a number of turns in the device being monitored. Similarly, variations in the resistance of the magnetoresistive elements in single turn sensors can be tracked to determine the magnetic field angle, which can be translated to the angular position of the device being monitored.

SUMMARY

The present disclosure provides a magnetic sensor package comprising a magnetic multi-turn sensor die and a magnetic single turn sensor die, in which both sensor dies are packaged together on the same lead frame. The present disclosure also provides a method of manufacturing the magnetic sensor package. The present disclosure also provides a magnetic sensor system comprising a rotating magnet and the magnetic sensor package, wherein the sensor package is arranged so that both sensor dies sit within a homogenous magnetic field, thereby ensuring that the output signal of each sensor is not corrupted by any stray fields.

A first aspect of the disclosure provides a magnetic sensor package, comprising at least one integrated device die comprising a first sensor portion having a sensing element configured to detect the orientation of a magnetic field generated by a rotating magnet, and a second sensor portion having a sensing element configured to detect a number of turns of the rotating magnet, a package substrate, wherein the at least one integrated device die is mounted onto the package substrate, and a housing, wherein the housing encases the package substrate at the at least one integrated device die.

As such, a single sensor package is provided that advantageously includes sensors for detecting both the angle of rotation and the number of turns of an external magnetic field. This sensor package can thus be placed in a position where both sensing portions experience the same magnetic field. If one sensing portion is closer than the other, it will experience a stronger magnetic field having a different magnitude in the x-y plane, which could lead to discrepancies between the respective sensor outputs. Furthermore, the sensor package provides a compact arrangement that can be placed in a position that experiences a homogenous magnetic field, that is, a magnetic field in which the field strength remains substantially the same, whilst the magnetic fields direction changes with rotation, which is particularly important for ensuring that the output of the angle sensing portion of the sensor package is accurate.

The at least one integrated device die may comprise a first integrated device die comprising the first sensor portion, and a second integrated device die comprising the second sensor portion. In such cases, the first integrated device die may be adjacent to the second integrated device die on the package substrate.

A top surface of the first integrated device die may be parallel with a top surface of the second integrated device die. This is particularly important for ensuring the first and second sensing portions experience the same magnetic field in the z-direction and thus measure the same magnetic field.

In some arrangements, the first integrated device die may be stacked onto the second integrated device die. Again, this helps to ensure that the first and second sensing portions experience and thus measure the same magnetic field.

The magnetic sensor package may further comprise an application-specific integrated circuit die mounted onto the package substrate. In some cases, the first integrated device die may be mounted onto the application-specific integrated circuit die.

One or both of the first integrated device die and the second integrated device die may be mounted to the package substrate using a die attach film. By using a die attach film, there are no concerns about epoxy material bleeding over the edge of the substrate, and so the integrated device dies may be placed close to the edge of the package substrate. Furthermore, the use of die attach film can prevent movement of the integrated device dies once the sensor package has been assembled and is in use.

In cases where the magnetic sensor package comprises an application-specific integrated circuit die, this may also be attached using a die attach film.

Alternatively, one or more of the first integrated device die, the second integrated device die and the application-specific integrated circuit die may be mounted to the package substrate using an epoxy die attach.

Advantageously, the package substrate may comprise a non-magnetic material. This is particularly important for preventing any distortion of the external magnetic field in which it is placed, which helps to improve the accuracy of the measurements of the sensor portion.

The package substrate further may comprise one or more leads for electrical connection.

It will of course be appreciated that the sensing element configured to detect the orientation of a magnetic field generated by a rotating magnet may be an anisotropic magnetoresistance (AMR), tunnel magnetoresistance (TMR), giant magnetoresistance (GMR), Hall or other magnetic based angle sensor. Similarly, the sensing element configured to detect a number of turns of the rotating magnet may be a tunnel magnetoresistance (TMR) or giant magnetoresistance (GMR) based multi-turn sensor.

A second aspect of the present disclosure provides a magnetic sensing system, comprising a rotatable magnet configured to generate a rotating magnetic field, and a magnetic sensor package comprising at least one integrated device die comprising a first sensor portion having a sensing element configured to detect the orientation of a magnetic field generated by a rotating magnet, and a second sensor portion having a sensing element configured to detect a number of turns of the rotating magnet, a package substrate, wherein the at least one integrated device die is mounted onto the package substrate, and a housing, wherein the housing encases the package substrate at the at least one integrated device die.

In some arrangements, the magnetic sensor package may be aligned with a rotational axis of the magnet. More specifically, a centre of the first sensing portion is aligned with the rotational axis of the magnet. In this respect, it is important the sensor providing angle sensing is positioned within a homogenous field, otherwise it may experience stray fields that could cause errors in the measured position.

In other arrangements, the magnetic sensor package may be offset from the rotational axis of the magnet. In such cases, the magnetic sensor package may be at a first position within a plane perpendicular to the rotational axis of the magnet, wherein the first position experiences a constant magnetic field strength as the magnet rotates. Again, this is important for ensuring that the angle sensing portion remains within a homogenous magnetic field.

In some cases, the magnetic sensing system may further comprise a shaft configured to rotate the magnet. This shaft may be part of the mechanical system, for example a steering system, that the magnetic sensor package is being used to monitor.

A third aspect of the disclosure provides a method of manufacturing a magnetic sensor package, the method comprising providing a package substrate, forming at least one integrated device die on the package substrate, the at least one integrated device die comprising a first sensor portion having a sensing element configured to detect the orientation of a magnetic field generated by a rotating magnet, and a second sensor portion having a sensing element configured to detect a number of turns of the rotating magnet, and forming a housing around the package substrate.

Forming the at least one integrated device die may further comprise forming a first integrated device die comprising the first sensor portion and forming a second integrated device die comprising the second sensor portion. In such cases, the first integrated device die may be formed on a first portion of the package substrate, and the second integrated device die may be formed on a second portion of the package substrate, the first portion being adjacent to the second portion.

The first and second integrated device dies may be configured such that a top surface of the first integrated device die is parallel with a top surface of the second integrated device die.

In some arrangements, the method may further comprise forming an application-specific integrated circuit die onto the package substrate. The first integrated device die may then be formed onto the application-specific integrated circuit die.

The method may further comprise attaching one or both of the first integrated device die and the second integrated device die to the package substrate using a die attach film.

In cases where the magnetic sensor package comprises an application-specific integrated circuit die, this may also be attached using a die attach film.

Alternatively, the method may comprise attaching one or more of the first integrated device die, the second integrated device die and the application-specific integrated circuit die to the package substrate using an epoxy die attach.

Advantageously, the package substrate may comprise a non-magnetic material.

In some arrangements, forming the housing may comprise providing a first molded component on a first side of the package substrate, providing a second molded component on a second side of the package substrate, and joining the first and second molded components to enclose the package substrate.

BRIEF DESCRIPTION OF THE DRAWINGS

The present disclosure will now be described by way of example only with reference to the accompanying drawings in which:

FIG. 18 illustrates a further example of a magnetic sensor package in accordance with an embodiment of the disclosure;

FIG. 19 illustrates a further example of a magnetic sensor package in accordance with an embodiment of the disclosure;

DETAILED DESCRIPTION

Magnetic multi-turn and single turn sensors can be used to monitor the turn count and angular position of a rotating shaft. Such magnetic sensing can be applied to a variety of different applications, such as automotive applications, medical applications, industrial control applications, consumer applications, and a host of other applications which use information regarding a position of a rotating component.

The present disclosure provides a magnetic sensor package comprising a magnetic single turn (ST) sensor and a magnetic multi-turn (MT) sensor packaged together on a single lead frame. The present disclosure also provides a method of positioning the magnetic sensor package in relation to a rotating magnet to ensure the ST sensor sits within a homogenous magnetic field and its signal is thereby not disturbed by stray fields. Consequently, the arrangement of the ST sensor and the MT sensor within the package will be based in part on the intended positioning of the sensor package once installed.

The ST sensor described herein may be an anisotropic magnetoresistance (AMR), tunnel magnetoresistance (TMR), giant magnetoresistance (GMR), Hall or other magnetic based ST angle sensor. Similarly, the MT sensor described herein may be a tunnel magnetoresistance (TMR) or giant magnetoresistance (GMR) based multi-turn sensor.

Figure 1:
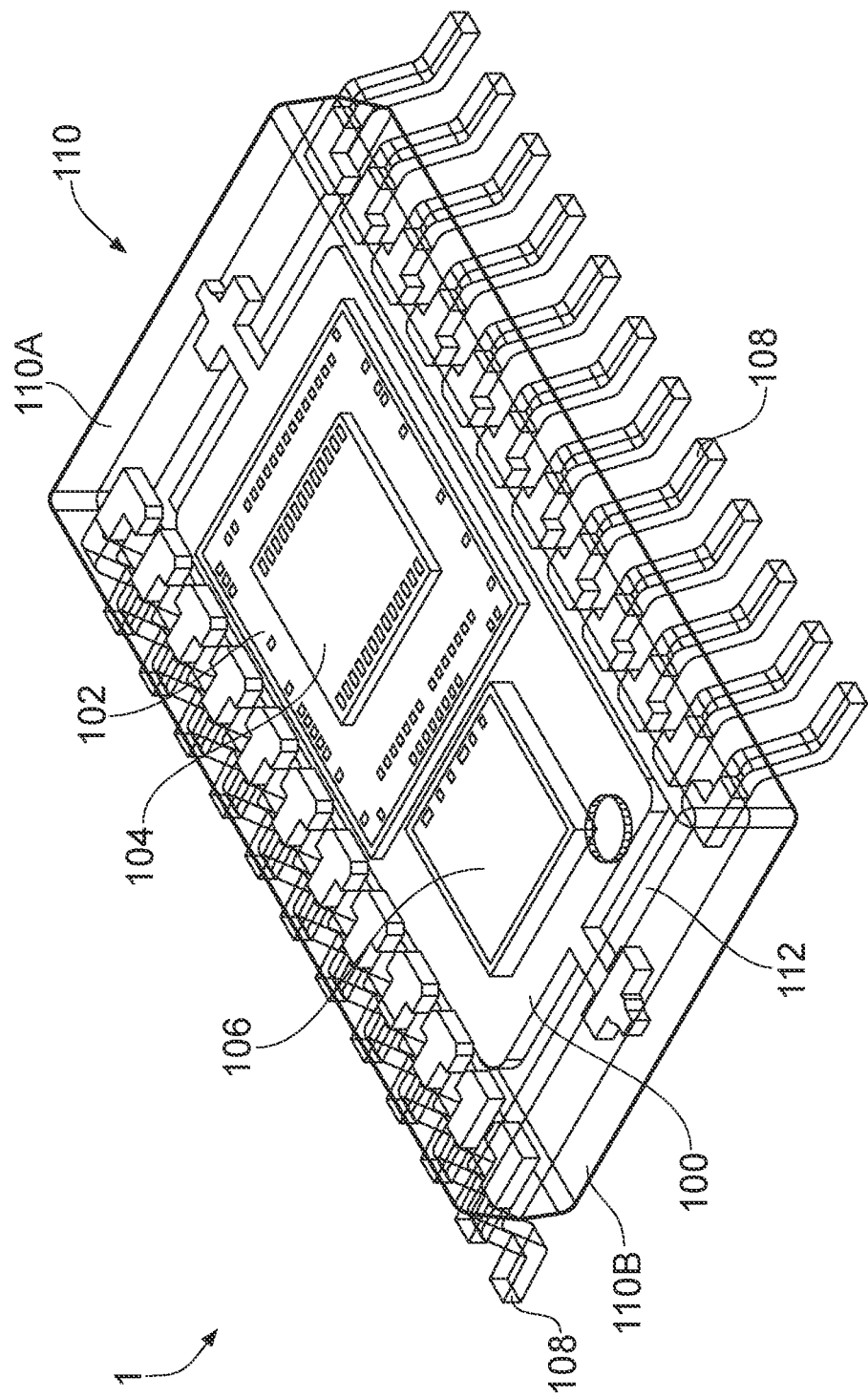
FIG. 1 is a perspective view of a magnetic sensor package in accordance with an embodiment of the disclosure.
Figure 2:
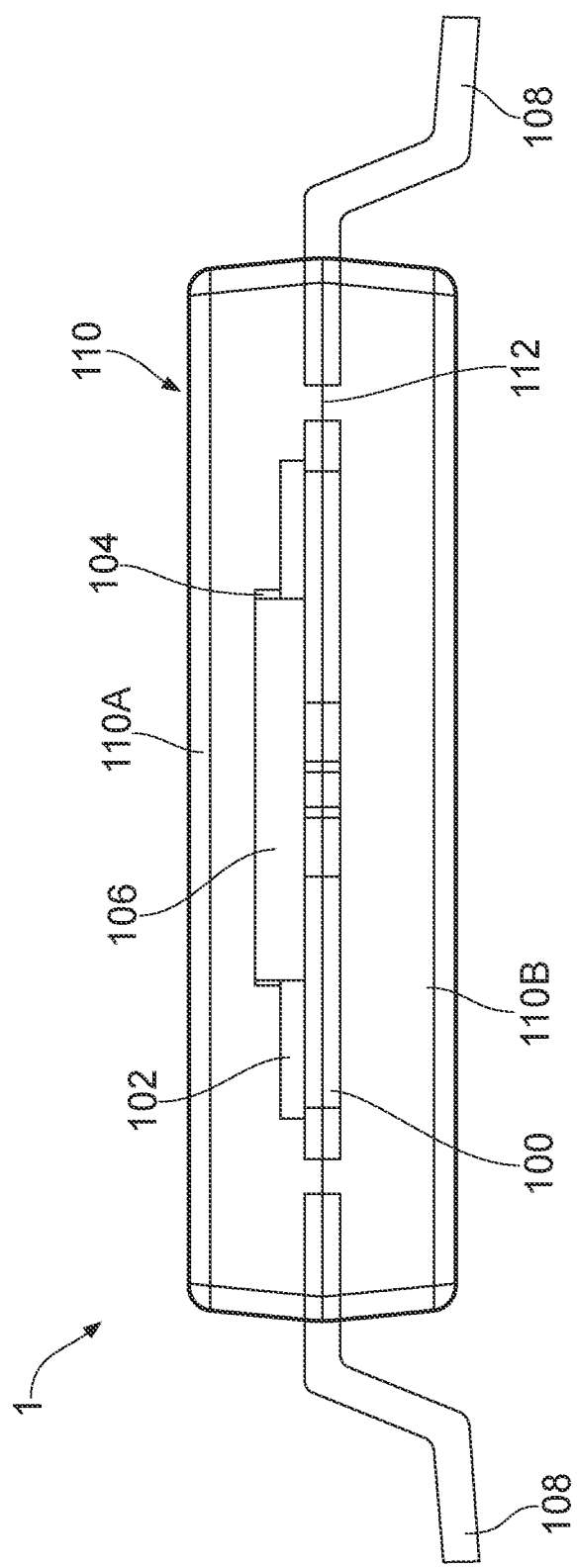
FIG. 2 is a cross sectional end view of the sensor package of FIG. 1.
Figure 3:
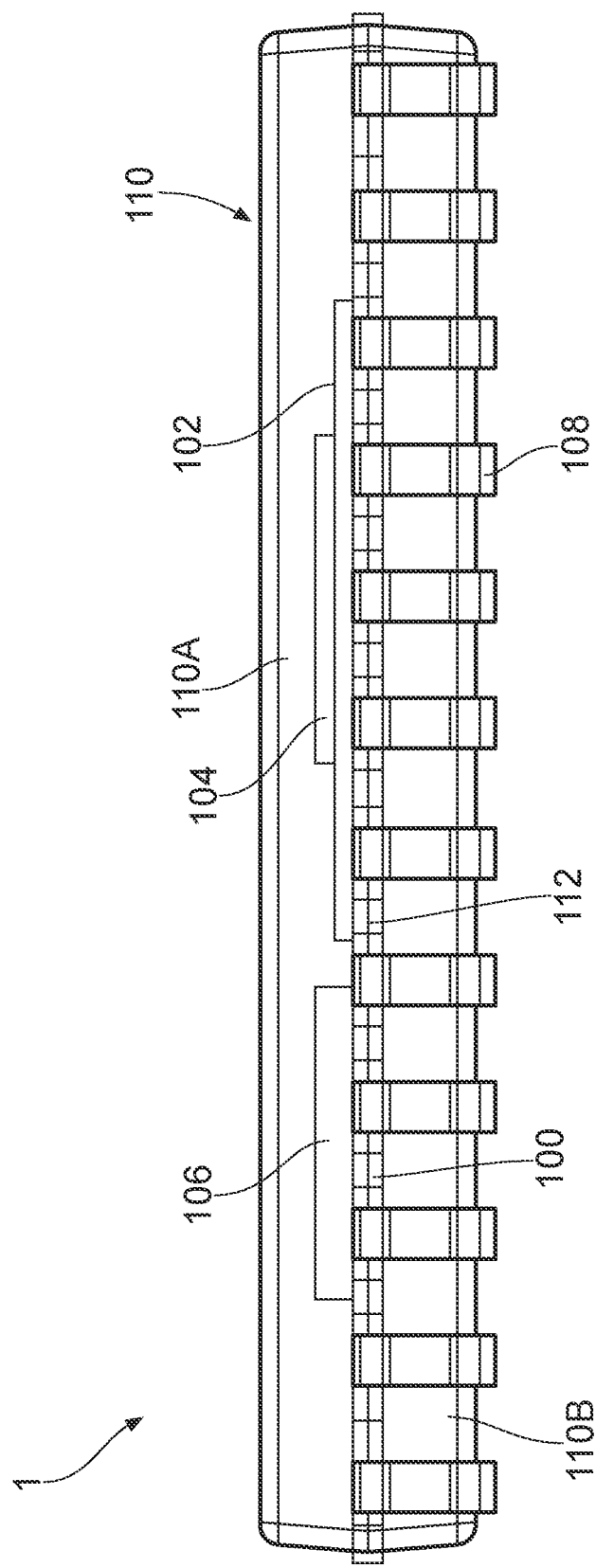
FIG. 3 is a cross sectional side view of the sensor package of FIG. 1.

FIGS. 1 to 3 illustrate a magnetic sensor package 1 in accordance with an embodiment of the present disclosure. The magnetic sensor package 1 comprises a package substrate 100, also referred to as the lead frame paddle, which may comprise a laminate substrate such as a printed circuit board (PCB) substrate, ceramic substrate, or any suitable type of substrate. An application specific integrated circuit (ASIC) die 102 is formed onto the package substrate 100, upon which a first integrated device die 104 is stacked, the first integrated die 104 in this case comprising a magnetic multi-turn (MT) sensing element configured to count the number of turns in a rotating magnetic field. Adjacent to the ASIC die 102 and MT sensor die 104 stack, a second integrated device die 106 is provided on the substrate 100, the second integrated device die 106 comprising a magnetic single turn (ST) sensing element configured to measure the angular position of a rotating magnetic field.

The ASIC die 102, MT sensor die 104 and ST sensor die 106 can be assembled and fixed to the substrate 100 in any suitable way, for example, using an epoxy die attach or a die attach film (DAF). Preferably, by using a DAF, there are no concerns about epoxy material bleeding over the edge of the substrate 100. As a result, the ASIC die 102 and MT sensor die 104 stack, as well as the ST sensor die 106, can be located close to the edge of the substrate 100, which may be preferable in applications where the sensor package 1 is positioned away from the rotational axis of the magnet, as will be described in more detail below. Furthermore, the use of DAF can prevent movement of the sensor dies 104 and 106 once the package 1 has been assembled and is in use, whereas the use of epoxy die attach can experience flow and shrink during the curing process. As will be described in more detail below, it is important that the sensor dies 104 and 106, particularly, the ST sensor die 106, do not move about once installed as part of a sensing system. The magnetoresistive elements in the ST and MT sensor are sensitive to changes in magnetic field strength and magnetic field angle, however, it is changes in the magnetic field angle that are of interest for the purpose of monitoring the position and number of turns of a magnetic field, and variations in magnetic field strength can cause errors in the sensor readings. The sensor dies 104 and 106 therefore need to be fixed in a location where there is a homogenous magnetic field in order to provide accurate readings, and therefore it is important that they do not shift to a position that is experiencing a different magnetic field strength.

Additionally, the MT sensor die 104 and ST sensor die 106 are configured such that the top surface of each die are aligned at the same level. That is to say, the distance from the package substrate 100 to the top surface of the MT sensor die 104 is the same as the distance from the package substrate 100 to the top surface of the ST sensor die 106. Consequently, when the magnetic sensor package 1 is placed in proximity to a magnet, both sensors are the same distance away from the magnet in the z direction and therefore experience the same magnetic field. If one sensor is closer than the other, it will experience a stronger magnetic field having a different magnitude in the x-y plane, which could lead to discrepancies between the respective sensor outputs.

The package substrate 100 includes leads 108 on the lower surface thereof to facilitate electrical connection to other electronic systems, for example, by way of another board, such as a printed circuit board. The package substrate 100 and leads 108 together can be considered the lead frame of the magnetic sensor package 1. The package substrate 100, ASIC die 102, MT sensor die 104 and ST sensor die 106 are all housed within a molded package body 110. For example, the package body 110 may comprise a non-conductive molding comprising a dual sided construction. As such, the molded package body 110 may comprise two hollow components 110A, 110B that are attached around the edges, for example, by way of thermal plastic welding or joining techniques such as thermal compression bonding, to form a housing. Electrical connections 112 between the die 102, 104 and 106 and the leads 108 may also be housed within the molded package body 110.

Figure 23:
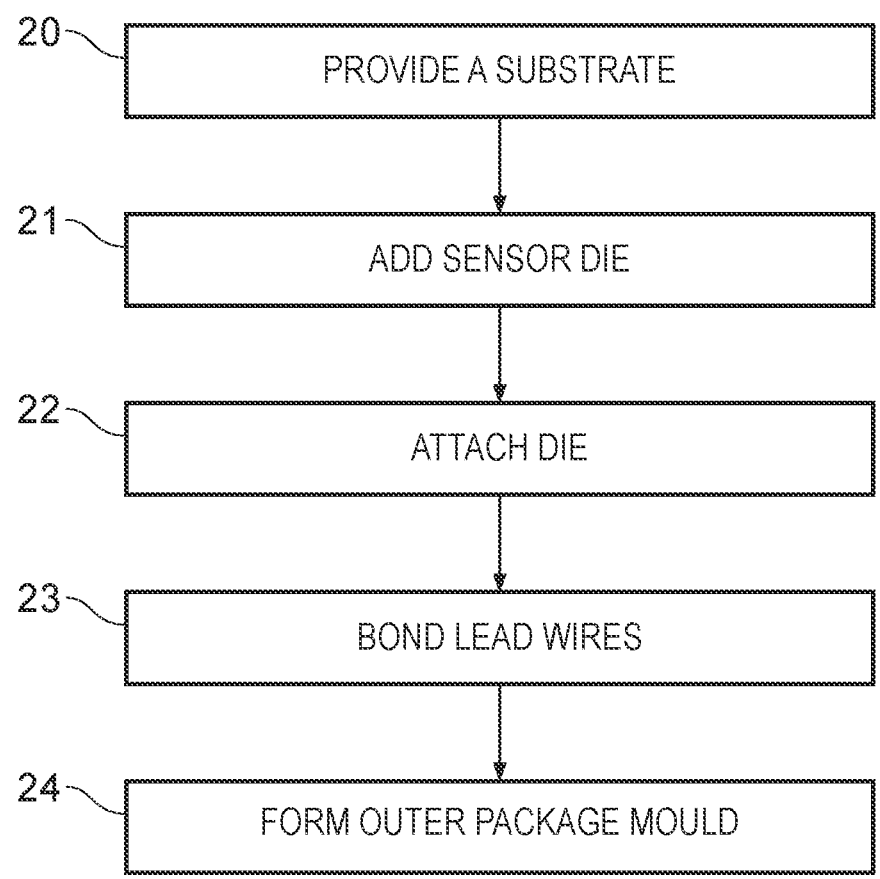
FIG. 23 is a flow diagram illustrating a method of manufacture in accordance with an embodiment of the disclosure.

The present disclosure also provides a method of manufacturing the magnetic sensor package 1 described herein, as illustrated by FIG. 23. A step 20, the package substrate 100 is first provided, the package substrate 100 comprising one or more leads 108. The package substrate 100 is advantageously made from a non-magnetic material, for example, a copper alloy. This is particularly important for preventing any distortion of the external magnetic field in which it is placed, which helps to improve the accuracy of the measurements made by the MT sensor die 104 and the ST sensor die 106 by ensuring that they are measuring the true magnetic field.

At step 21, the MT sensor die 104 and the ST sensor die 106 are then formed onto the package substrate 100. The ASIC die 102 is also formed onto the package substrate 100, in this example, so that the ASIC die 102 is formed between the package substrate 100 and the MT sensor die 104. However, it will be appreciated that the ASIC die 102 may be located at a different position on the package substrate 100.

At step 22, the MT sensor die 104, the ST sensor die 106 and the ASIC die 102 are attached to the package substrate 100. As described above, the ASIC die, 102, MT sensor die 104 and ST sensor die 106 may be attached using a die attach film (DAF) or an epoxy die attach. The use of a DAF has particular advantages in that it avoids any material bleeding over the edge of the substrate 100, which allows the sensor dies 104 and 106 to be placed close to the edge, and ensures that there is no movement of the sensor dies 104 and 106 once the package 1 has been assembled and is in use.

At step 23, the leads 108 are bonded to the sensor dies 102, 104 and 106 using a suitable bond wire interconnect, with the package body 110 then being formed around the package substrate 100 at step 24 to form a housing that encases the package body, ASIC die 102, MT sensor die 104 and ST sensor die 106. In this respect, the package body 110 is formed such that the leads 108 extend therefrom to facilitate electrical connection to other components. As discussed above, the package body 110 may be formed by joining two molded components 110A, 110B using any suitable joining techniques. Preferably, the package body 110 is formed using a suitable plastic compound.

Figure 4:
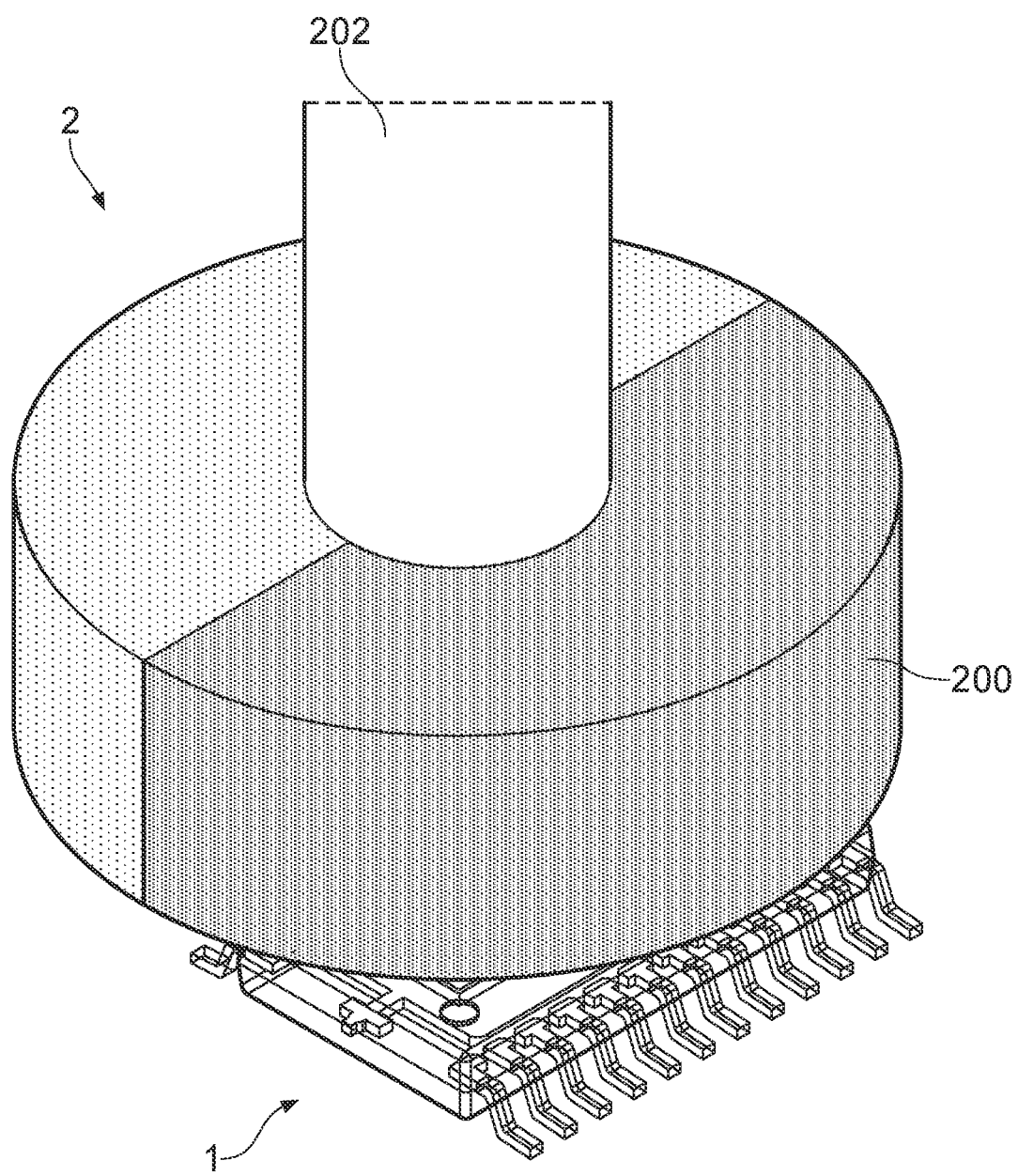
FIG. 4 is an example of the magnetic sensor package of FIG. 1 in use.
Figure 5:
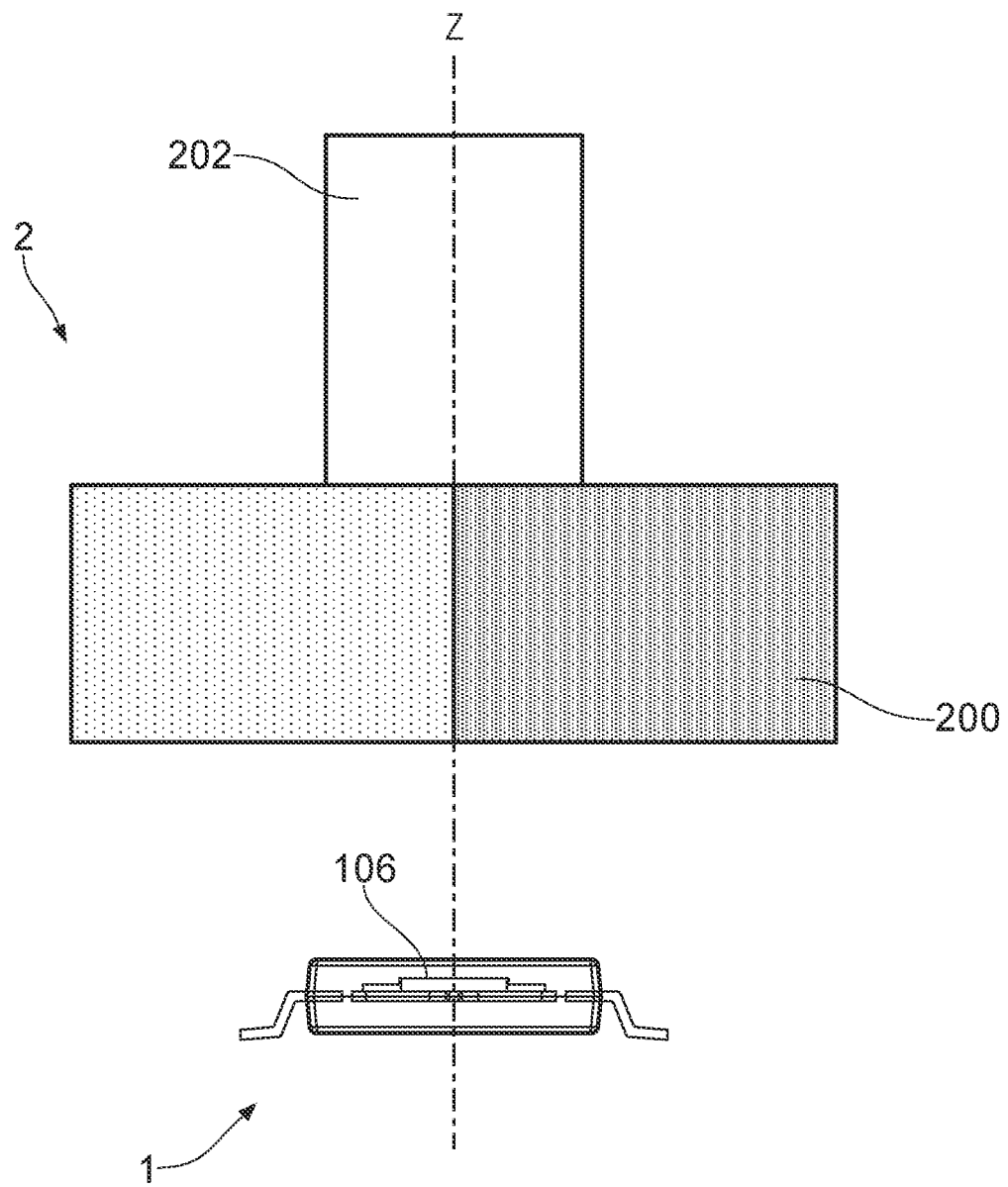
FIG. 5 further illustrates the example the sensor package of FIG. 1 in use.
Figure 6:
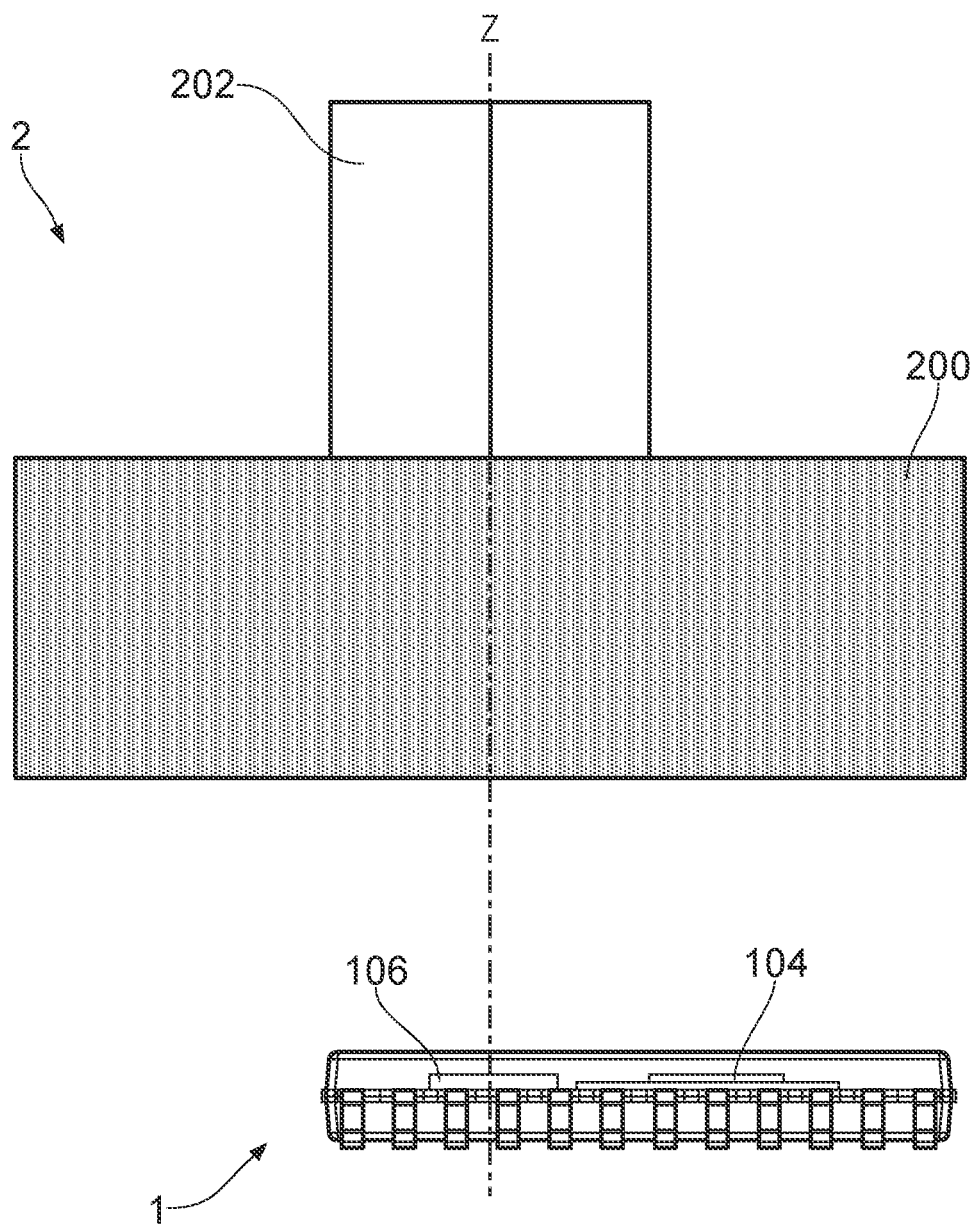
FIG. 6 further illustrates the example the sensor package of FIG. 1 in use.

FIGS. 4 to 6 illustrate a first method of positioning the magnetic sensor package 1 in relation to a magnetic assembly 2. The magnetic assembly 2 comprises a circular magnet 200 disposed on the end of a rotating shaft 202. The rotating shaft 202 may then be coupled to a rotating component (not shown), for example, a steering wheel. In this embodiment, the magnetic sensor package 1 is positioned in line with the rotating shaft 202 of the magnetic assembly 2 (a so called "on shaft" arrangement). Specifically, the magnetic sensor package 1 is positioned such that the ST sensor die 106 is directly aligned with the rotational axis Z of the magnetic assembly 2, as shown in FIGS. 5 and 6. More specifically, the central point of the ST sensor die 106 is aligned with the magnetic centre of the rotating magnet 200, such that the ST sensor die 106 sits within a homogenous magnetic field, that is, a magnetic field in which the field strength remains substantially the same, whilst the magnetic fields direction changes with rotation. This helps to prevent the ST sensor die 106 from experiencing any stray fields that could cause errors in the measured position. The multi-turn sensor die 104 is arranged so that is it also substantially in line with the rotational axis Z of the magnetic assembly 2, to the extent that any stray fields that it may experience will not be sufficient to interrupt its turn count. In this respect, MT sensors have a higher tolerance for stray magnetic fields than ST sensors since MT sensors are usually measuring the number of turns of a magnetic field in 90° or 180° increments, and therefore do not utilize the same degree of accuracy as an ST sensor.

Figure 7:
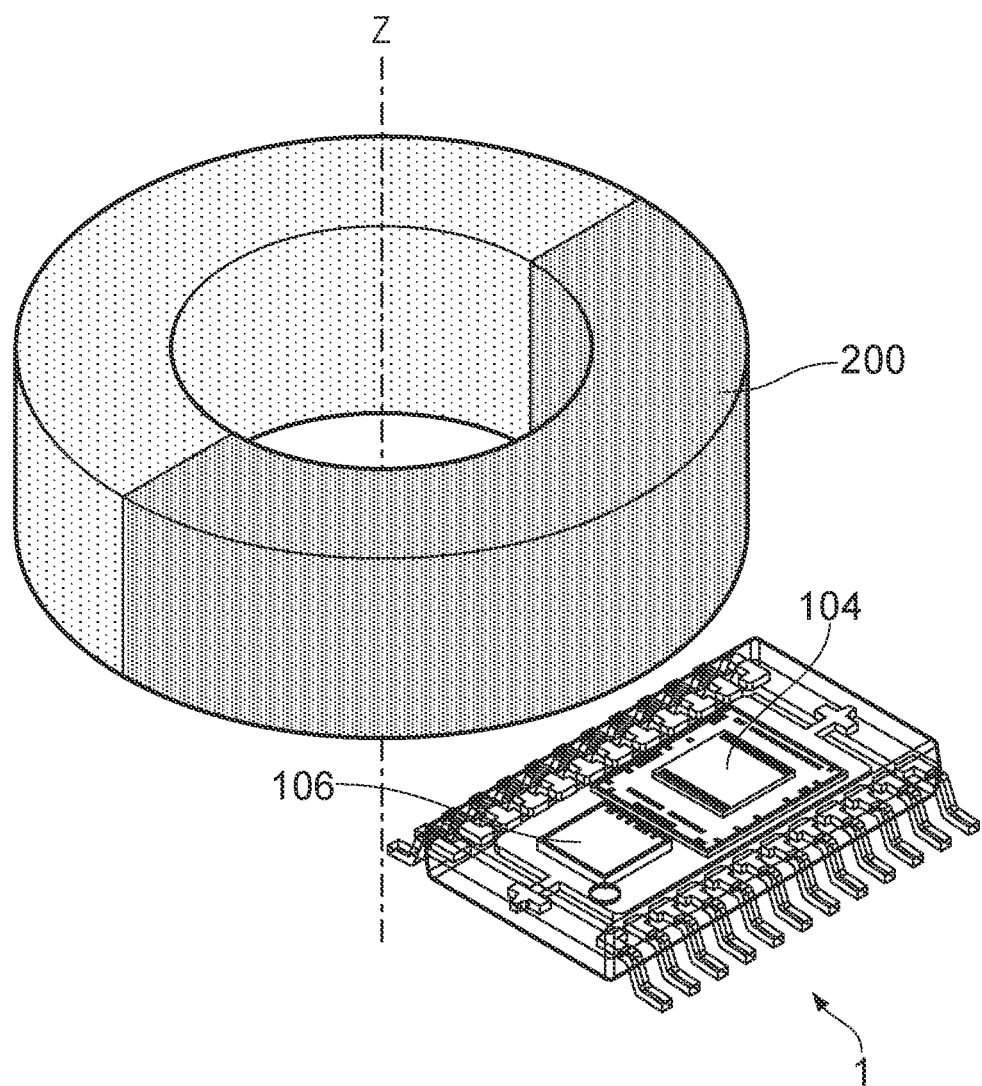
FIG. 7 illustrates a further example of the sensor package of FIG. 1 in use.
Figure 8:
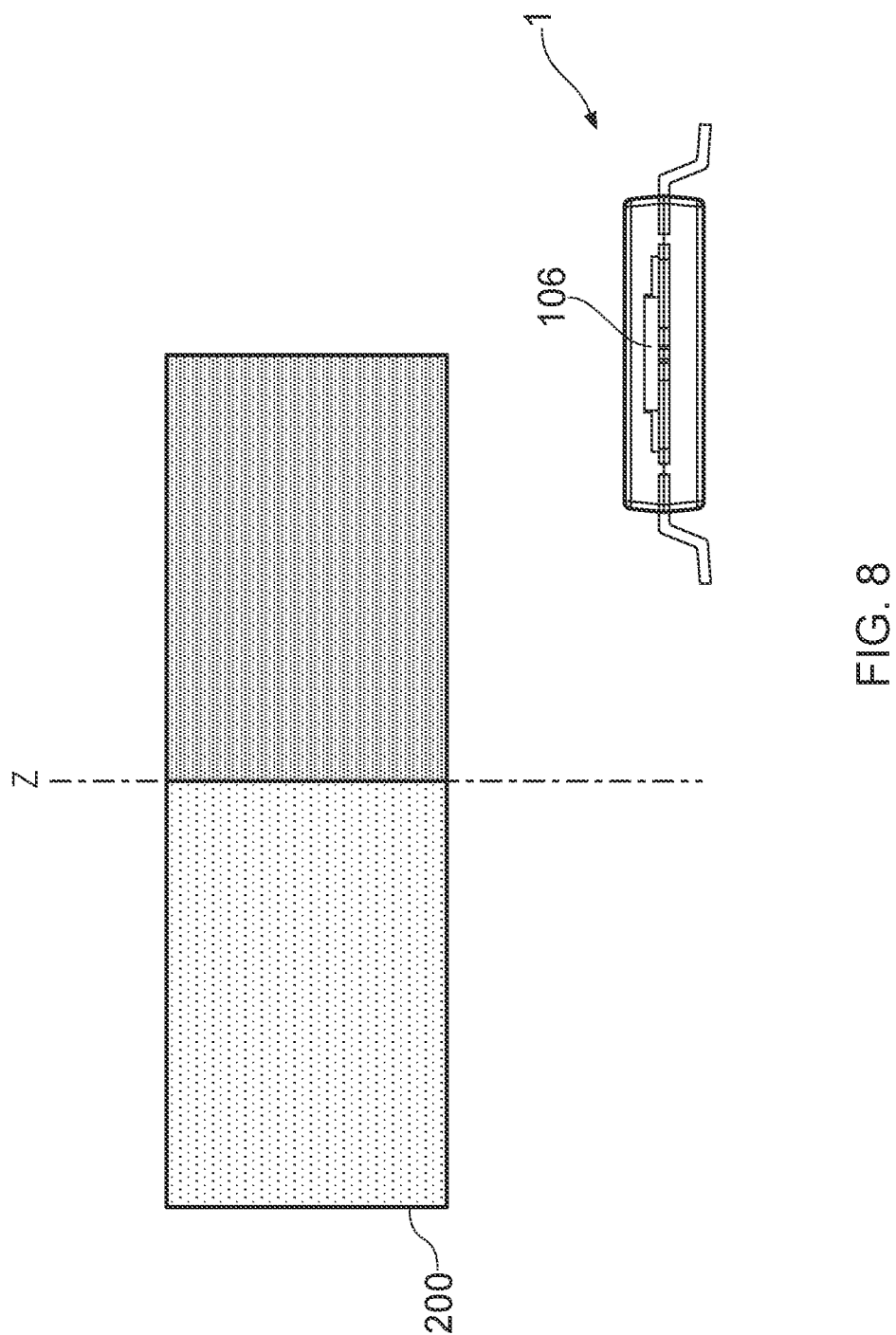
FIG. 8 further illustrates a further example of the sensor package of FIG. 1 in use.
Figure 9:
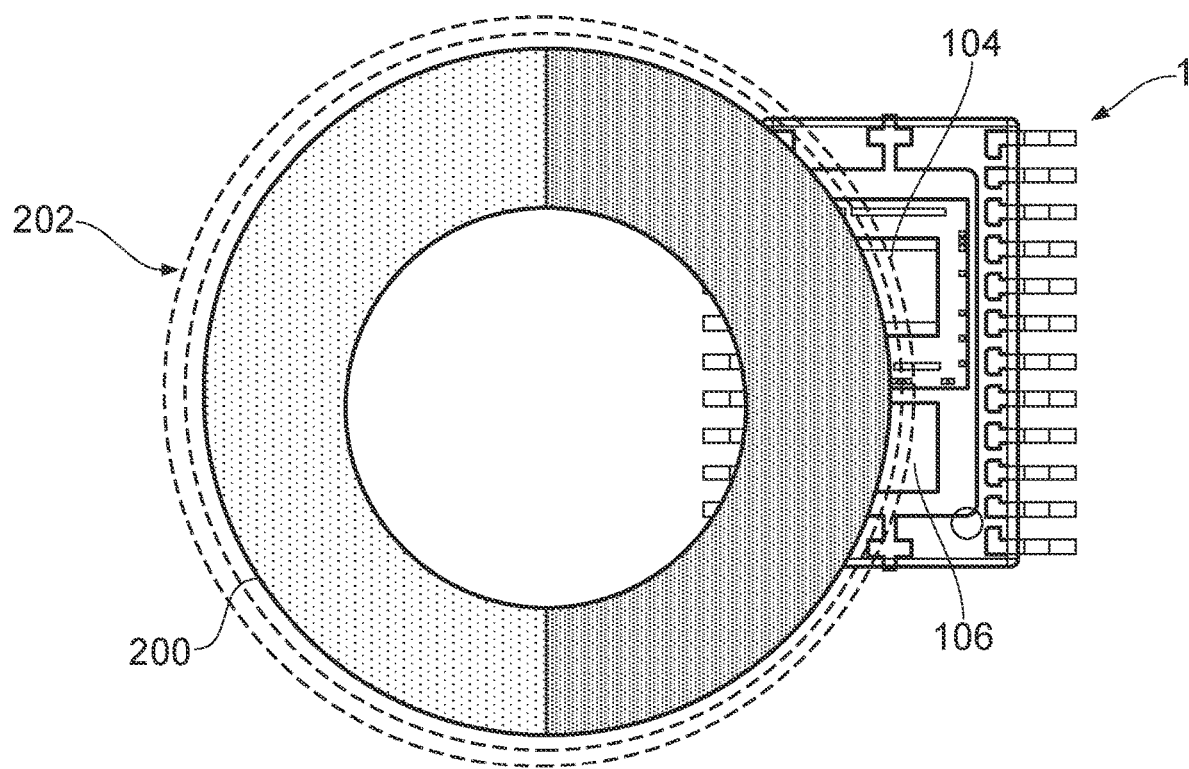
FIG. 9 further illustrates a further example of the sensor package of FIG. 1 in use.

FIGS. 7 to 9 show a further embodiment of a method of arranging a magnetic sensor package 1 in relation to a rotating magnet 200. The rotating shaft is not shown, however, it will be appreciated that the rotating magnet 200 will be coupled to a rotating shaft in the same way as that shown in FIGS. 4 to 6. In this example, the magnetic sensor package 1 is positioned such that the magnetic sensor package 1 is positioned away from rotational axis Z of the magnet 200 (a so called "off axis" arrangement) in the X-Y plane perpendicular to the rotational axis Z. As shown in more detail in FIG. 9, the magnetic sensor package 1 is arranged such that both the ST sensor die 106 and the MT sensor die 104 are positioned within a magnetic corridor (denoted here as 202) in which the magnetic field strength is constant, and the magnetic field direction changes. As with the previous example, by arranging both the sensor dies 104 and 106 within this corridor 202, both are positioned within a homogenous magnetic field. As such, the magnetic field strength in this corridor 202 stays substantially the same, whilst the field angle changes proportional to the angle of rotation of the magnet around the z-axis. To ensure that both sensors are within the magnetic corridor 202, the MT sensor die 104 and the ST sensor die 106 need to be substantially the same distance from the rotational axis Z. For example, a ring magnet 200 having an outer diameter of 14 mm, an inner diameter of 8 mm and a height of 3.5 mm, the magnetic sensor package 1 will sit within the magnetic corridor whereby there is substantially no change in the magnetic field strength at distance of around 3 mm from the magnet 200 in the z direction and at a radial distance of around 6.5 mm from the rotational axis Z.

In both of the above arrangements, the MT sensor die 104 and ST sensor die 106 are the same distance from the magnet 200 in the z-direction. Consequently, both sensor dies 104 and 106 experience the same magnetic field.

FIGS. 10 to 21 illustrate a number of further different ways in which a magnetic multi-turn sensor and a magnetic single turn sensor may be arranged within a single lead frame package.

Figure 11:
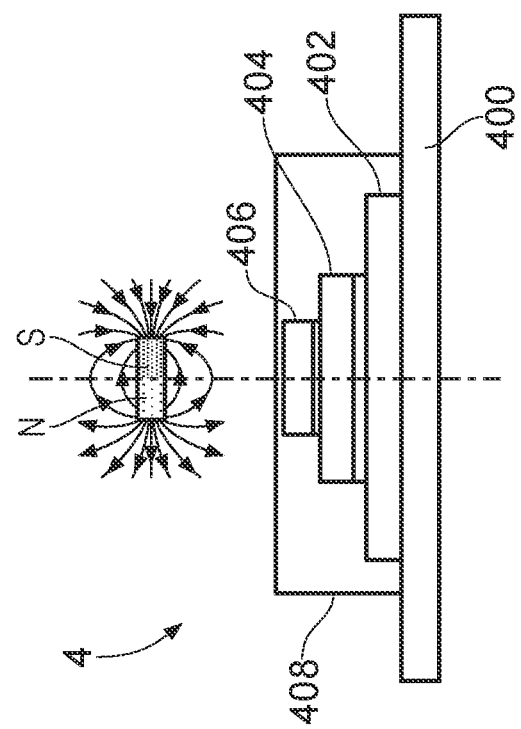
FIG. 11 illustrates a further example of a magnetic sensor package in accordance with an embodiment of the disclosure.
Figure 10:
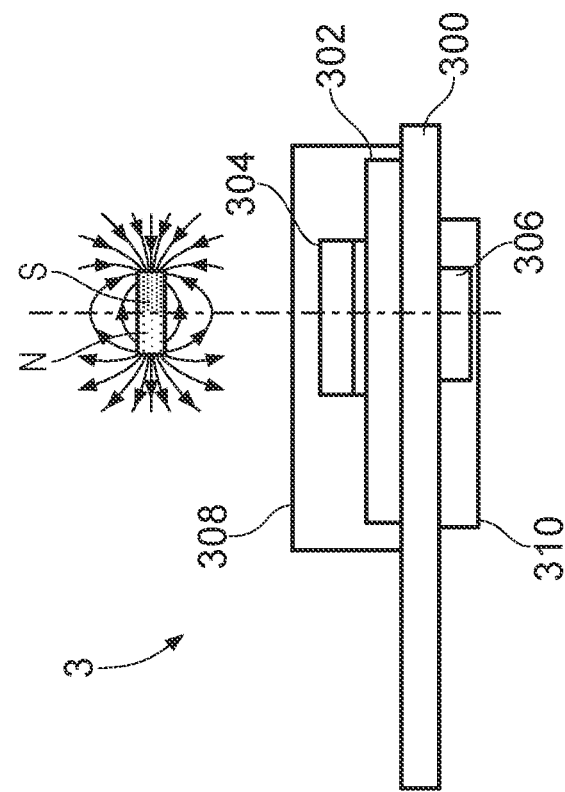
FIG. 10 illustrates a further example of a magnetic sensor package in accordance with an embodiment of the disclosure.

FIGS. 10 and 11 show two different ways of stacking the single turn and multi-turn sensor such that both the multi-turn sensor and single turn sensor are aligned with the rotational axis of the magnetic. FIG. 10 shows an arrangement 3 in which the multi-turn sensor die 304 and ASIC die 302 are arranged in a single package 308 on a first side of a printed circuit board 300, whilst the single turn sensor die 306 is arranged in a second package 310 on the second side of the printed circuit board 300. FIG. 11 shows an alternative arrangement 4 in which the single turn sensor die 406 is mounted on top of the multi-turn sensor die 404, which is then mounted on top of the ASIC die 402, the whole stack then being arranged in a single package 408 on a printed circuit board 400.

Figure 13:
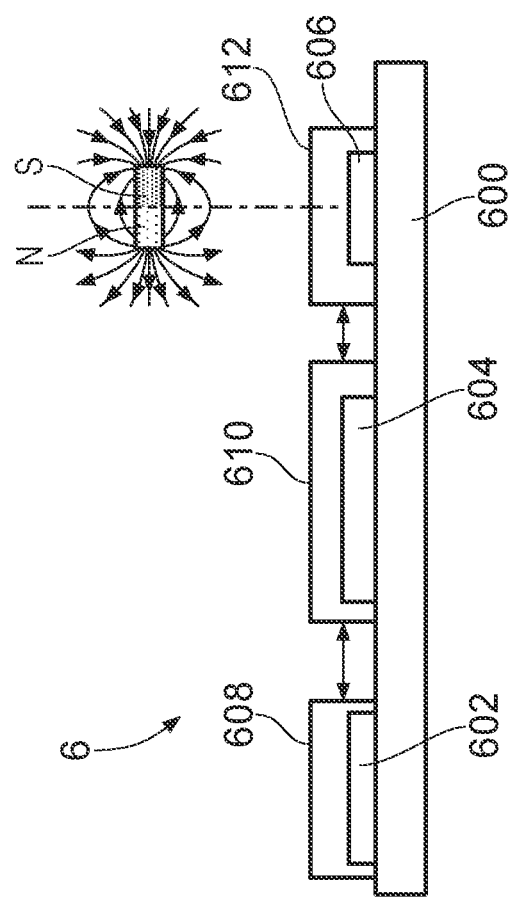
FIG. 13 illustrates a further example of a magnetic sensor package in accordance with an embodiment of the disclosure.
Figure 12:
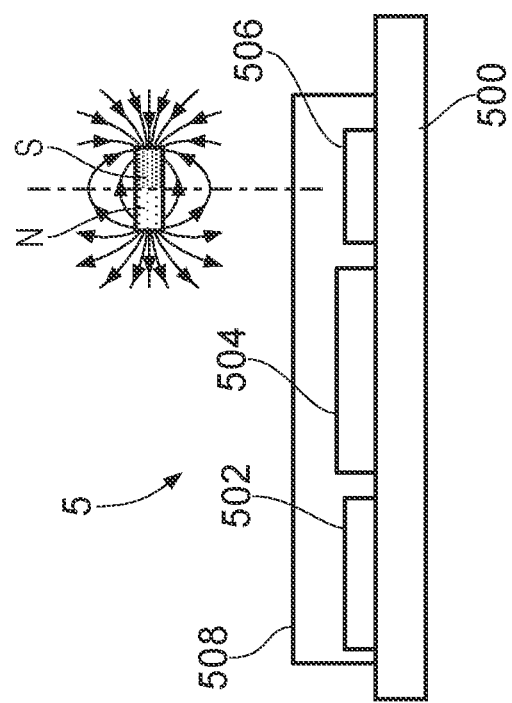
FIG. 12 illustrates a further example of a magnetic sensor package in accordance with an embodiment of the disclosure.

FIGS. 12 and 13 show two arrangements in which the single turn sensor die and multi-turn sensor die are arranged side by side. FIG. 12 shows an arrangement 5 in which the ASIC die 502, multi-turn sensor die 504 and single turn sensor die 506 are arranged side by side in series within a single package 508 over a substrate 500. In the FIG. 13 arrangement 6, each of the ASIC die 602, multi-turn sensor die 604 and single turn sensor die 606 are arranged in individual connected packages 608, 610 and 612 respectively arranged on the same printed circuit board 600. In both examples, the arrangements are positioned such that the centre of the single turn sensor die is aligned with the rotational axis of the rotating magnet.

Figure 15:
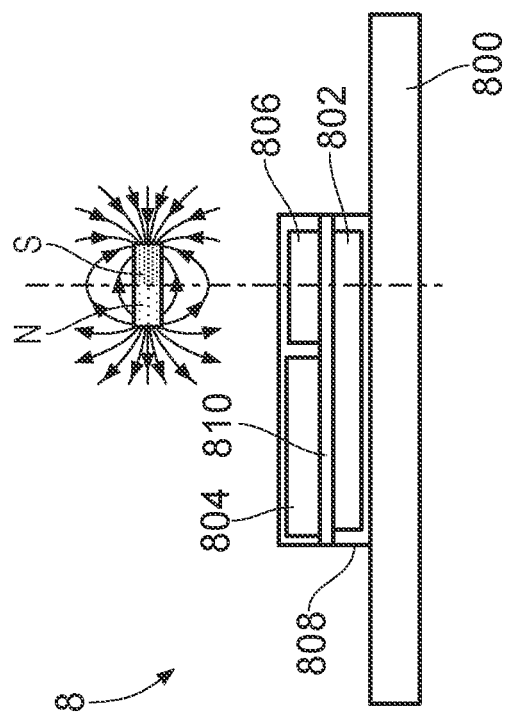
FIG. 15 illustrates a further example of a magnetic sensor package in accordance with an embodiment of the disclosure.
Figure 14:
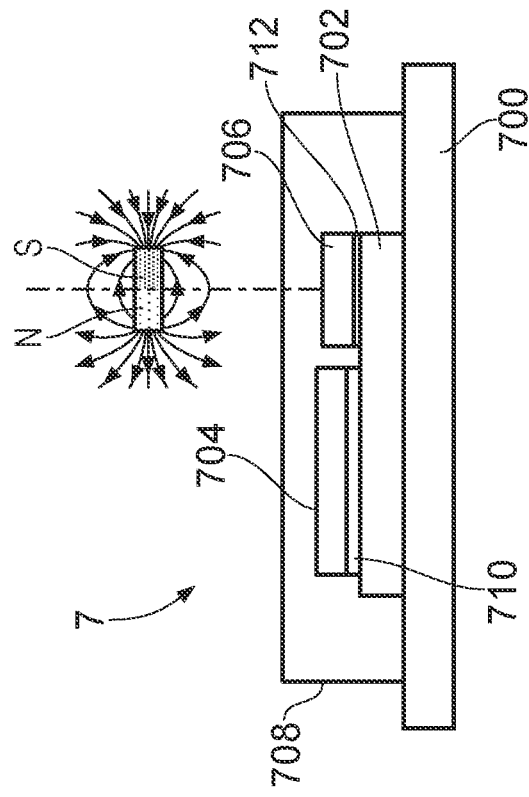
FIG. 14 illustrates a further example of a magnetic sensor package in accordance with an embodiment of the disclosure.

FIGS. 14 and 15 both show two possible ways of arranging both the multi-turn sensor die and single turn sensor die side by side and on top of the ASIC die, the whole arrangement then being enclosed within the same package on a printed circuit board. In both cases, the package is arranged such that the single turn sensor is aligned with the rotational axis of the rotating magnet. In the FIG. 14 arrangement 7 in a package 708, the MT sensor die 704 is arranged on a first lead frame 710 disposed on the ASIC die 702 over a substrate 700, whilst the ST sensor die 706 is arranged on a second lead frame 712 disposed on the ASIC die 702. In FIG. 15 arrangement 8 in a package 808, the MT sensor die 804 and ST sensor die 806 are arranged on one side of a lead frame 810, with the ASIC die 802 arranged on the other side and be positioned between the lead frame 810 and the substrate 800.

Figure 17:
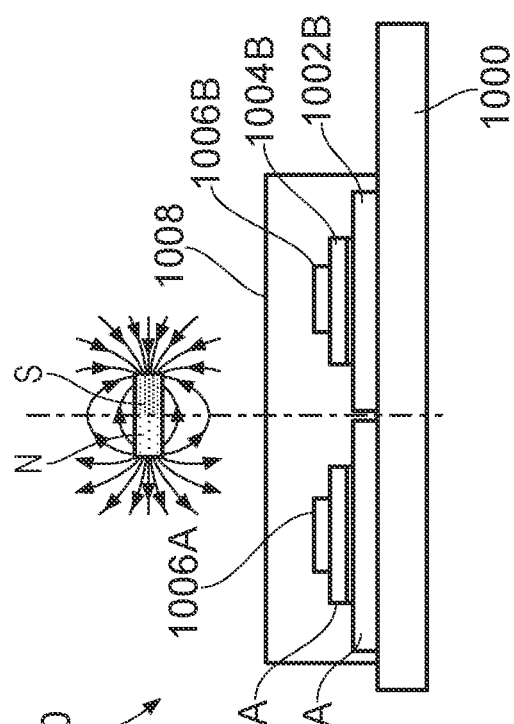
FIG. 17 illustrates a further example of a magnetic sensor package in accordance with an embodiment of the disclosure.
Figure 16:
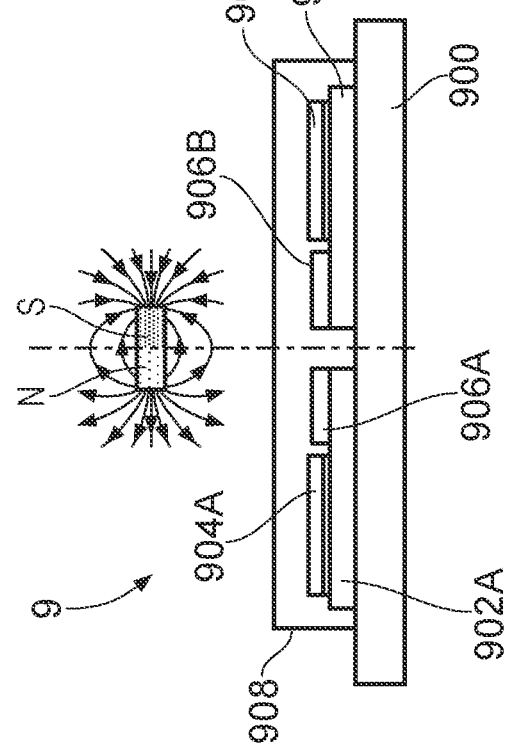
FIG. 16 illustrates a further example of a magnetic sensor package in accordance with an embodiment of the disclosure.

FIGS. 16 and 17 illustrate magnetic sensor packages comprising two sensor arrangements within the same package. FIG. 16 illustrates a sensor package 9 in a package 908 comprising a first sensor arrangement comprising an ASIC die 902A over a substrate 900 with a multi-turn sensor die 904A and single turn sensor die 906A mounted thereon in series, and a second sensor arrangement also comprising an ASIC die 902B with a single turn sensor die 906B and multi-turn sensor die 904B mounted thereon in series. In this arrangement, the two single turn sensor dies 906A and 906B are arranged at a position perpendicular to the rotational axis of the magnet that is equidistant from the center of the magnet, the two single turn sensors 906A and 906B thus providing a differential measurement. FIG. 17 illustrates a similar arrangement 10 in a package 1008 over a substrate 1000, in which in each sensor arrangement is a stack comprising a single turn sensor die 1006A, 1006B mounted on top a multi-turn sensor die 1004A, 1004B, which is then mounted on an ASIC die 1002A, 1002B. Similarly, each sensor stack is arranged at a position perpendicular to the rotational axis of the magnet that is equidistant from the center of the magnet.

FIG. 18 illustrates an alternative arrangement 11 in a package 1108 over a substrate 1100 in which the single turn sensor die 1106 is mounted on top of the multi-turn sensor die 1104 which in turn is mounted on top of the ASIC die 1102 via wire bonds 1110. FIG. 19 then shows a sensor package 12 in a package 1208 over a substrate 1200 comprising a single turn sensor die 1206 and multi-turn sensor die 1204 stack, which are positioned adjacent to the ASIC die 1202 on the same lead frame 1210.

Figure 21:
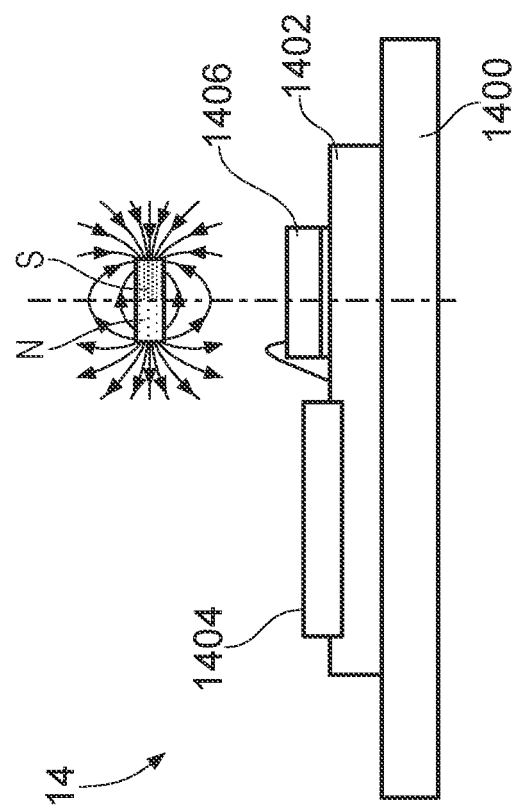
FIG. 21 illustrates a further example of a magnetic sensor package in accordance with an embodiment of the disclosure.
Figure 20:
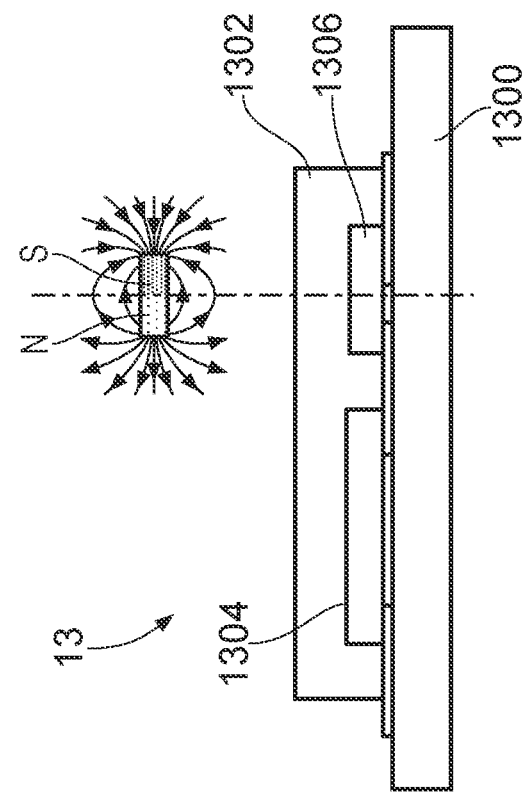
FIG. 20 illustrates a further example of a magnetic sensor package in accordance with an embodiment of the disclosure.

FIG. 20 illustrates a further arrangement 13 in which the single turn sensor die 1306 and multi-turn sensor die 1304 are arranged side by side within a package 1302 over a substrate 1300. FIG. 21 shows an alternative arrangement 14 in which the single turn sensor die 1406 and multi-turn sensor die 1404 are arranged side by side and molded into a laminate material 1402 over a substrate 1400.

Whilst FIGS. 10 to 21 illustrate the sensor packages positioned in a "on-axis" arrangement with the single turn sensor die aligned with the rotational axis of the magnet, it will also be appreciated that the sensor packages may also be positioned in an "off-axis" arrangement, such as that described with reference to FIGS. 7 to 9, the sensor packages being placed in the magnetic corridor of the magnet where the magnetic field strength is constant.

Figure 22:
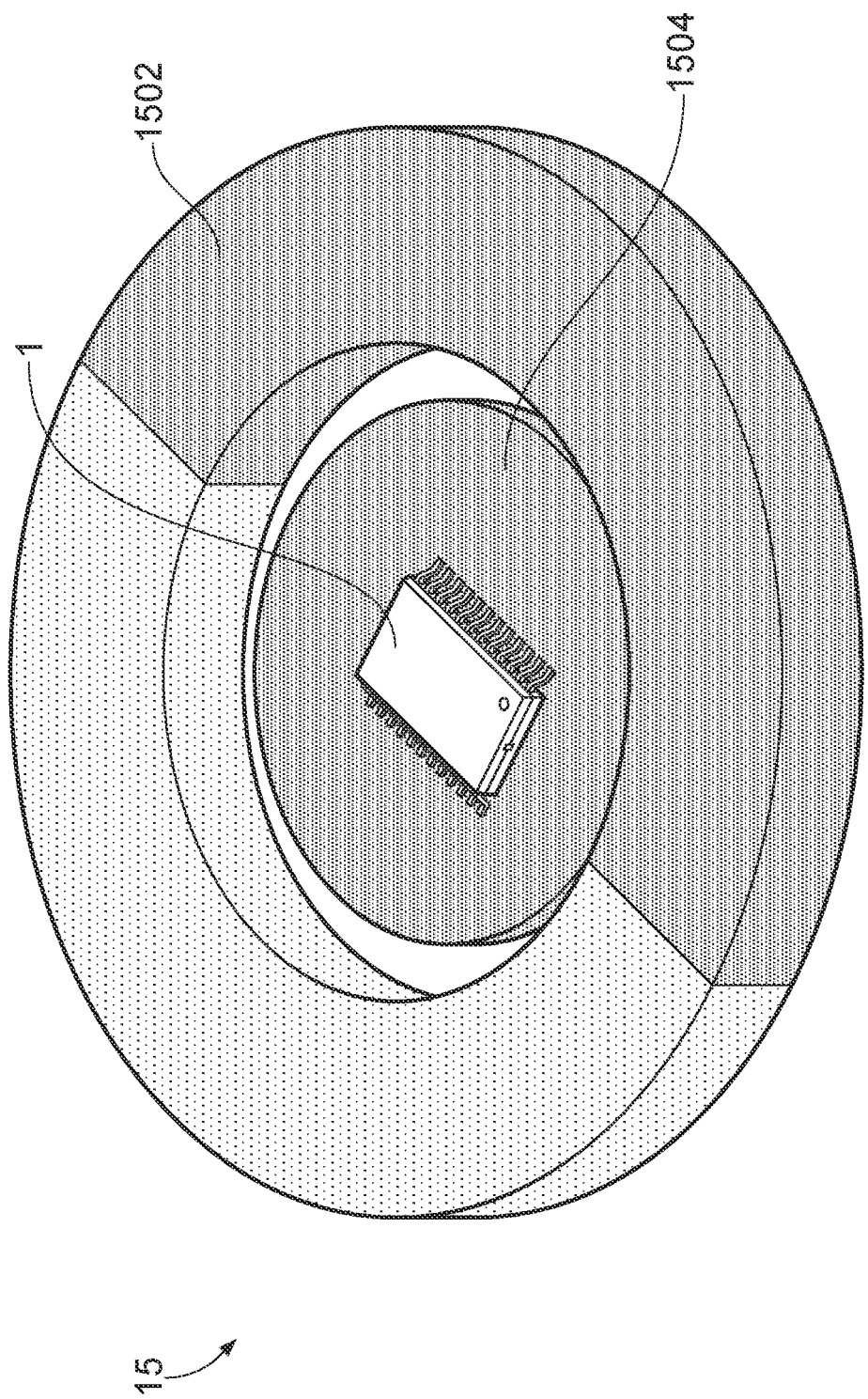
FIG. 22 illustrates a further example of the sensor package of FIG. 1 in use.

FIG. 22 illustrates a further "on-axis" arrangement 15, in which the sensor package 1 is positioned on a substrate 1504 and placed inside of a ring magnet 1502. It will be appreciated that the ring magnet 1502 will be mounted to some form mechanical system that rotates, and that the sensor package 1 may be any of those described herein. By placing the sensor package 1 inside the ring magnet 1502, the sensor package 1 experiences the magnetic field generated by the magnet 1502 at the point where it is most homogenous and least likely to be affected by stray magnetic fields.

Whilst the examples described above comprise an MT sensor die and a separate ST sensor die, it will be appreciated that the multi-turn (MT) sensing element and the single turn (ST) sensing element may be provided on the same integrated die within the sensor package.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

What is claimed is:

1. A magnetic sensor package, comprising:
 at least one integrated device die comprising:
  a single turn sensor having a sensing element configured to detect the orientation of a magnetic field generated by a rotating magnet positioned in a direction along an axis relative to the single turn sensor; and a multi-turn sensor having a sensing element configured to detect a number of turns of the rotating magnet, the multi-turn sensor comprising a different type sensor from the single turn sensor and positioned such that the sensing element of the single turn sensor at least partially overlaps the sensing element of the multi-turn sensor along the axis;

a package substrate, wherein the at least one integrated device die is mounted onto the package substrate; and a housing, wherein the housing encases the package substrate at the at least one integrated device die.

2. A magnetic sensor package according to claim 1, wherein the at least one integrated device die comprises a first integrated device die comprising the single turn sensor, and a second integrated device die comprising the multi-turn sensor.

3. A magnetic sensor package according to claim 2, wherein the first integrated device die is stacked onto the second integrated device die.

4. A magnetic sensor package according to claim 3, wherein the at least one integrated device die further comprises an application specific integrated circuit (ASIC) die coupled to the package substrate.

5. A magnetic sensor package according to claim 4, wherein the ASIC die is disposed between the package substrate and the second integrated device die.

6. A magnetic sensor package according to claim 2, wherein one or both of the first integrated device die and the second integrated device die are mounted to the package substrate using a die attach film.

7. A magnetic sensor package according to claim 1, wherein the package substrate comprises a non-magnetic material.

8. A magnetic sensing system, comprising:
a rotatable magnet configured to generate a rotating magnetic field;
a magnetic sensor package, comprising:
at least one integrated device die comprising:
a single turn sensor having a sensing element configured to detect the orientation of a magnetic field generated by a rotatable magnet positioned in a direction along an axis relative to the single turn sensor; and
a multi-turn sensor having a sensing element configured to detect a number of turns of the rotatable magnet, the multi-turn sensor comprising a different type sensor from the single turn sensor and positioned such that the sensing element of the single turn sensor at least partially overlaps the sensing element of the multi-turn sensor along the axis;

a package substrate, wherein the at least one integrated device die is mounted onto the package substrate; and a housing, wherein the housing encases the package substrate at the at least one integrated device die.

9. A magnetic sensing system according to claim 8, wherein the magnetic sensor package is aligned with a rotational axis of the rotatable magnet.

10. A magnetic sensing system according to claim 8, wherein a center of the single turn sensor is aligned with the rotational axis of the rotatable magnet.

11. A magnetic sensing system according to claim 8, wherein the magnetic sensor package is offset from the rotational axis of the rotatable magnet.

12. A magnetic sensing system according to claim 8, wherein the magnetic sensor package is at a first position within a plane perpendicular to the rotational axis of the rotatable magnet.

13. A magnetic sensing system according to claim 12, wherein the first position experiences a constant magnetic field strength as the magnet rotates.

14. A method of manufacturing a magnetic sensor package, the method comprising:
providing a package substrate;
forming at least one integrated device die on the package substrate, the at least one integrated device die comprising a single turn sensor having a sensing element configured to detect the orientation of a magnetic field generated by a rotating magnet positioned in a direction along an axis relative to the single turn sensor, and a multi-turn sensor having a sensing element configured to detect a number of turns of the rotating magnet such that the sensing element of the single turn sensor at least partially overlaps the sensing element of the multi-turn sensor along the axis, the multi-turn sensor comprising a different type sensor from the single turn sensor; and
forming a housing around the package substrate.

15. A method of manufacture according to claim 14, wherein forming the at least one integrated device die comprises forming a first integrated device die comprising the single turn sensor and forming a second integrated device die comprising the multi-turn sensor.

16. A method of manufacture according to claim 15, further comprising attaching one or both of the first integrated device die and the second integrated device die to the package substrate using a die attach film.

17. A method of manufacture according to claim 15, wherein the at least one integrated device die further comprises an application specific integrated circuit (ASIC) die coupled to the package substrate.

18. A method according to claim 17, wherein the ASIC die is disposed between the package substrate and the second integrated device die.

19. A method of manufacture according to claim 14, wherein the package substrate comprises a non-magnetic material.

20. A method of manufacture according to claim 14, wherein forming the housing comprises:
providing a first molded component on a first side of the package substrate;
providing a second molded component on a second side of the package substrate; and
joining the first and second molded components to enclose the package substrate.

* * * * *